US012635362B2

(12) United States Patent
Hwang

(10) Patent No.: US 12,635,362 B2
(45) Date of Patent: May 19, 2026

(54) ORGANIC LIGHT EMITTING DIODE DISPLAY DEVICE INCLUDING SLIT PATTERN

(71) Applicant: LG Display Co., Ltd., Seoul (KR)

(72) Inventor: Jae-Won Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 18/469,043

(22) Filed: Sep. 18, 2023

(65) Prior Publication Data

US 2024/0215340 A1     Jun. 27, 2024

(30) Foreign Application Priority Data

Dec. 23, 2022    (KR) ......................... 10-2022-0183518

(51) Int. Cl.
H10K 59/124      (2023.01)
H10K 59/80       (2023.01)
H10K 59/122       (2023.01)
H10K 59/38        (2023.01)

(52) U.S. Cl.
CPC ......... H10K 59/124 (2023.02); H10K 59/879 (2023.02); *H10K 59/122* (2023.02); *H10K 59/38* (2023.02)

(58) Field of Classification Search
CPC .. H10K 59/124; H10K 59/879; H10K 59/122; H10K 59/38
See application file for complete search history.

(56) References Cited

U.S. PATENT DOCUMENTS

| 2014/0151653 | A1* | 6/2014 | Kim ..................... | H10K 59/124 |
| | | | | 438/34 |
| 2017/0125489 | A1* | 5/2017 | Jang ..................... | H10K 59/351 |
| 2017/0125742 | A1* | 5/2017 | Park ................. | H10K 59/80515 |
| 2019/0363284 | A1* | 11/2019 | Yasuda ................ | H10K 59/873 |
| 2024/0260359 | A1* | 8/2024 | Kim ..................... | H10K 71/00 |

FOREIGN PATENT DOCUMENTS

| KR | 20170027267 A | * | 3/2017 | .......... H10K 50/858 |
| KR | 20170036156 A | | 4/2017 | |
| KR | 20190080055 A | | 7/2019 | |

OTHER PUBLICATIONS

Of Jiang et al. (KR 20170027267 A, machine translation, Mar. 2017) (Year: 2017).*

* cited by examiner

*Primary Examiner* — Tracie Y Green
(74) *Attorney, Agent, or Firm* — Seed Intellectual Property Law Group LLP

(57)      ABSTRACT

An organic light emitting diode display device includes a substrate having a plurality of subpixels. The device includes an overcoat layer on the substrate. The device includes a light emitting diode in each of the plurality of on the overcoat layer. In some embodiments, a top surface of the overcoat layer in adjacent two of the plurality of subpixels includes a plurality of microlenses having different rotation angles. The top surface of the overcoat layer between the adjacent two of the plurality of subpixels includes a slit pattern corresponding to the rotation angles of the plurality of microlenses.

13 Claims, 8 Drawing Sheets

ORGANIC LIGHT EMITTING DIODE DISPLAY DEVICE INCLUDING SLIT PATTERN

CROSS-REFERENCE TO RELATED APPLICATIONS

The present application claims the priority benefit of Korean Patent Application No. 10-2022-0183518, filed in Republic of Korea on Dec. 23, 2022, which is hereby incorporated by reference herein in its entirety into the present application.

BACKGROUND

Technical Field

The present disclosure relates to a display device, and more particularly, to an organic light emitting diode display device where a pattern matching rate is improved using a slit pattern having an information on a rotation angle of a microlens.

Description of the Related Art

Recently, with the advent of an information-oriented society, the interest in information displays for processing and displaying a massive amount of information and the demand for portable information media have increased. As such, a display field has rapidly advanced. Thus, various light and thin flat panel display devices have been developed and highlighted.

Among the various flat panel display devices, an organic light emitting diode (OLED) display device is an emissive type device that does not include a backlight unit used in a non-emissive type device such as a liquid crystal display (LCD) device. As a result, the OLED display device has a light weight and a thin profile.

Further, the OLED display device has advantages in a viewing angle, a contrast ratio and a power consumption as compared with the LED device. The OLED display device is driven with a direct current (DC) low voltage and has a relatively rapid response speed. Since inner elements of the OLED display device has a solid state, the OLED display device has a relatively strong resistance to an external impact and has a relatively wide temperature range.

BRIEF SUMMARY

The inventors have realized that in the prior art OLED display device, most of a light generated in an emitting layer is lost while the light is emitted to an exterior through various elements, and the light emitted to the exterior is only about 20% of the light generated in the emitting layer. Since an amount of a light emitted from the emitting layer increases according to an amount of a current applied to a light emitting diode, a luminance of a light may be increased by applying a larger current to the light emitting diode. However, a power consumption is increased and a life time is reduced.

Various embodiments of the present disclosure is directed to a display device that substantially obviates the technical problems in the related art including the above-identified problems.

Various embodiments of the present disclosure provide an organic light emitting diode display device where a pattern matching rate and an accuracy of a measured position are improved by performing an inspection step using a slit pattern corresponding to a rotation angle of a microlens at a periphery of each subpixel.

Various embodiments of the present disclosure provide an organic light emitting diode display device where a pattern matching rate and an accuracy of a measured position are improved and a light leakage between adjacent subpixels is reduced or minimized by forming a slit pattern corresponding to a rotation angle of a microlens as a plurality of slit lines each including at least one slit bar.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

Some embodiments of the present disclosure describe an organic light emitting diode display device that includes: a substrate having a plurality of subpixels; an overcoat layer on the substrate; and a light emitting diode in each of the plurality of subpixels on the overcoat layer, wherein a top surface of the overcoat layer in each of the adjacent two of the plurality of subpixels includes a plurality of microlenses, the plurality of microlenses in one of the adjacent two subpixels have a different rotation angle from the rotation angle of the plurality of microlenses in the other of the adjacent two subpixels, and wherein the top surface of the overcoat layer between the adjacent two of the plurality of subpixels includes a slit pattern corresponding to the rotation angle of the plurality of microlenses in one of the adjacent two subpixels.

It is to be understood that both the foregoing general description and the following detailed description are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
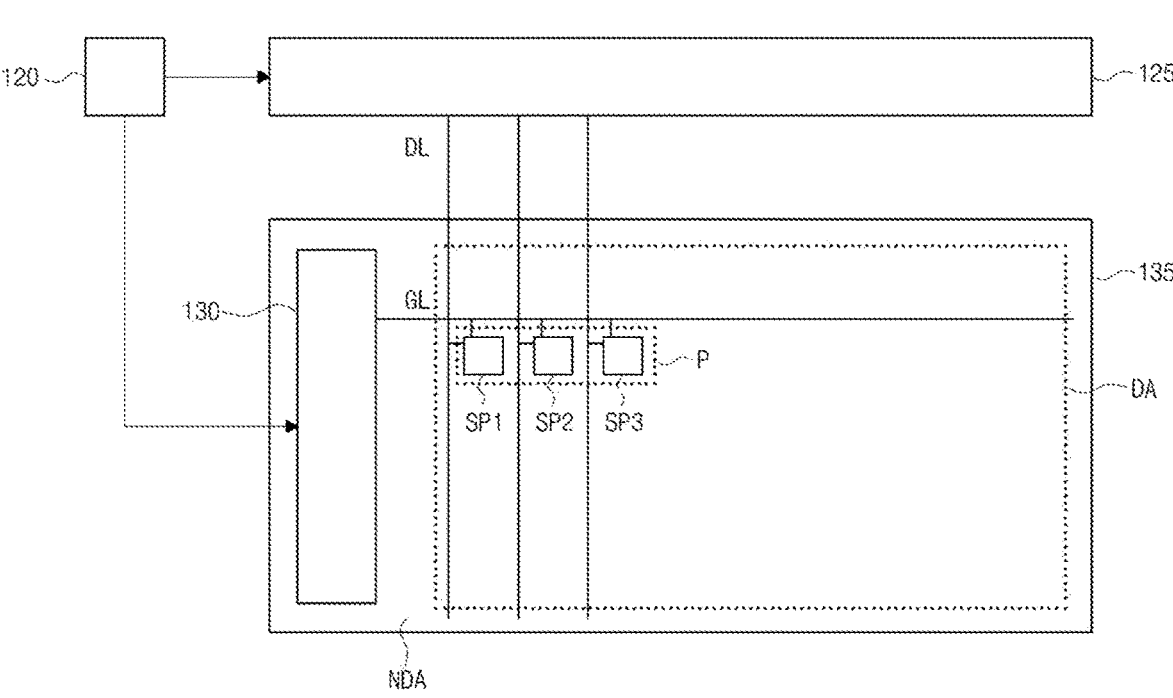
FIG. 1 is a view showing an organic light emitting diode display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Hereinafter, an organic light emitting diode display device according to embodiments of the present disclosure will be described in detail with reference to the accompanying drawings.

FIG. 1 is a view showing an organic light emitting diode display device according to a first embodiment of the present disclosure.

In FIG. 1, an organic light emitting diode (OLED) display device 110 according to a first embodiment of the present disclosure includes a timing controlling unit 120, a data driving unit 125, a gate driving unit 130 and a display panel 135.

The timing controlling unit 120 generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The timing controlling unit 120 transmits the image data and the data control signal to the data driving unit 125 and transmits the gate control signal to the gate driving unit 130.

The data driving unit 125 generates a data signal (a data voltage) using the data control signal and the image data transmitted from the timing controlling unit 120 and transmits the data signal to a data line DL of the display panel 135.

The gate driving unit 130 generate a gate signal (a gate voltage) using the gate control signal transmitted from the timing controlling unit 120 and supplies the gate signal to a gate line GL of the display panel 135. Further, the gate driving unit 130 may generate an emission signal according to a structure of each subpixel SP1, SP2 and SP3 and may supply the emission signal to the display panel 135.

The gate driving unit 130 may have a gate in panel (GIP) type to be formed in a non-display area NDA of the display panel 135 having the gate line GL, the data line DL and a pixel P.

The display panel 135 includes a display area DA at a central portion thereof and a non-display area NDA surrounding the display area DA. The display panel 135 displays an image using the gate signal and the data signal. For displaying an image, the display panel 135 includes a plurality of pixels P, a plurality of gate lines GL and a plurality of data lines DL in the display area DA.

Each of the plurality of pixels P includes first, second and third subpixels SP1, SP2 and SP3, and the gate line GL and the data line DL cross each other to define the first, second and third subpixels SP1, SP2 and SP3. Each of the first, second and third subpixels SP1, SP2 and SP3 is connected to the gate line GL and the data line DL.

For example, the first, second and third subpixels SP1, SP2 and SP3 may correspond to one of red, green, blue and white colors.

Figure 2:
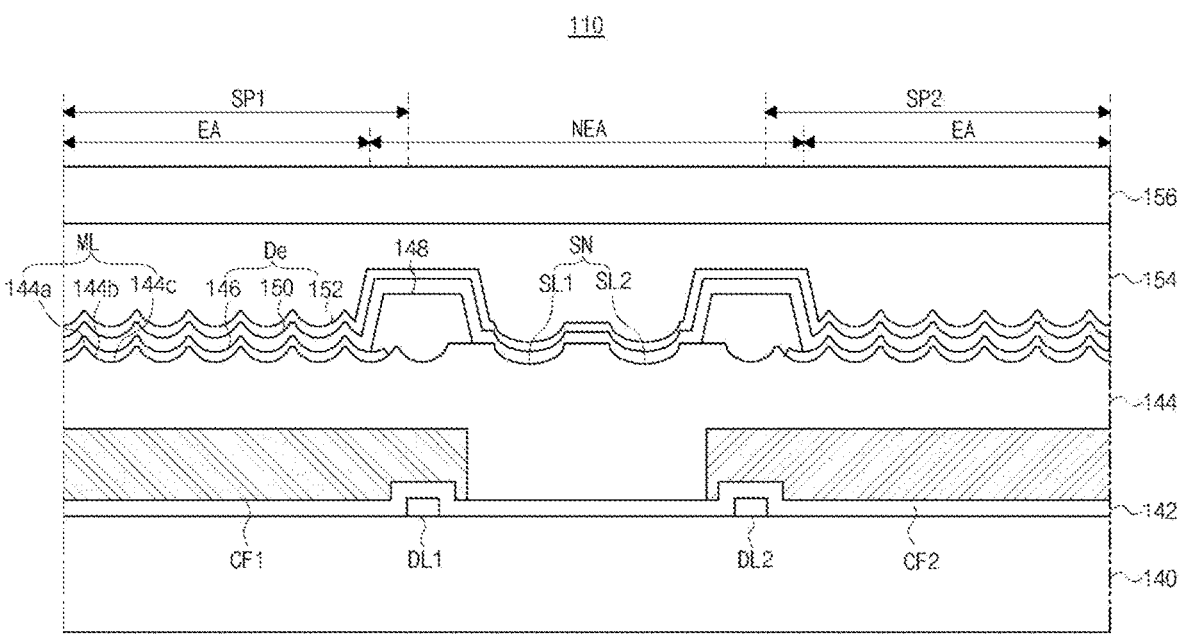
FIG. 2 is a cross-sectional view showing an organic light emitting diode display device according to a first embodiment of the present disclosure.

Each of the first, second and third subpixels SP1, SP2 and SP3 may include a plurality of thin film transistors (TFTs) such as a switching TFT and a driving TFT, a storage capacitor and a light emitting diode De (of FIG. 2).

FIG. 2 is a cross-sectional view showing an organic light emitting diode display device according to a first embodiment of the present disclosure. The organic light emitting diode (OLED) display device may be of a bottom emission type.

In FIG. 2, the OLED display device 110 according to a first embodiment of the present disclosure includes a light emitting diode (LED) De in each of first and second subpixels SP1 and SP2 on a substrate 140.

Although not shown, each of the first and second subpixels SP1 and SP2 of the OLED display device 110 may further include a switching TFT, a driving TFT, a sensing TFT and a storage capacitor. The switching TFT, the driving TFT and the sensing TFT may have the same structure as each other.

The substrate 140 includes the first and second subpixels SP1 and SP2, and each of the first and second subpixels SP1 and SP2 includes an emission area EA where the LED De is disposed and a non-emission area NEA surrounding the emission area EA. The non-emission area NEA is disposed between the first and second subpixels SP1 and SP2.

The substrate 140 may be formed of a glass or a plastic such as polyimide.

First and second data lines DL1 and DL2 are disposed in each of the first and second subpixels SP1 and SP2 on the substrate 140, and a protecting layer 142 is disposed on the first and second data lines DL1 and DL2 over the entire substrate 140.

Although not shown, the switching TFT, the driving TFT and the sensing TFT are disposed between the substrate 140 and the protecting layer 142. Each of the switching TFT, the driving TFT and the sensing TFT may include a semiconductor layer on the substrate 140, a gate insulating layer on the semiconductor layer, a gate electrode and a gate line GL on the gate insulating layer, an interlayer insulating layer on the gate electrode and the gate line GL and a drain electrode and a source electrode on the interlayer insulating layer.

The first and second data lines DL1 and DL2 cross the gate line GL to define the first and second subpixels SP1 and SP2, respectively, and are connected to the source electrodes of the switching TFTs of the first and second subpixels SP1 and SP2, respectively.

The protecting layer 142 may include an inorganic insulating material such as silicon oxide (SiO2) and silicon nitride (SiNx) or an organic insulating material such as benzocyclobutene (BCB) and acrylic resin.

First and second color filters CF1 and CF2 are disposed in the first and second subpixels SP1 and SP2, respectively, on the protecting layer 142, and an overcoat layer 144 is disposed on the first and second color filters CF1 and CF2 over the entire substrate 140.

Each of the first and second color filters CF1 and CF2 may transmit only a component of a predetermined wavelength among a white colored light emitted from the LED De toward the substrate 140. In another embodiment, a quantum dot (QD) that emits a light of a predetermined wavelength through a re-emission using a white colored light emitted from the LED De toward the substrate 140 or a color filter having a quantum dot instead of the first and second color filters CF1 and CF2 may be disposed between the protecting layer 142 and the overcoat layer 144.

A top surface of the overcoat layer 144 in the emission area EA includes a plurality of microlenses ML, and each of the plurality of microlenses ML includes a maximum portion 144a having a relatively great height, a minimum portion 144c having a relatively small height and a slanting portion 144b between the maximum portion 144a and the minimum portion 144c. The minimum portion 144c at a center thereof, the slanting portion 144b at both sides of the minimum portion 144c and the maximum portion 144a at both sides of the slanting portion 144b constitute a single microlens ML.

In a first embodiment, the maximum portion 144a, the slanting portion 144b and the minimum portion 144c exemplarily have a downwardly convex shape. In another embodiment, the maximum portion 144a and an upper half part of the slanting portion 144b may have an upwardly convex shape, and a lower half part of the slanting portion 144b and the minimum portion 144c may have a downwardly convex shape. Alternatively, in another embodiment, the maximum portion 144a, the slanting portion 144b and the minimum portion 144c may have an upwardly convex shape. The shape of the microlens ML may be variously modified.

A slit pattern SN is disposed on the overcoat layer 144 corresponding to the non-emission area NEA between the first and second subpixels SP1 and SP2. The slit pattern SN includes first and second slit lines SL1 and SL2, and each of the first and second slit lines SL1 and SL2 includes at least one first slit bar SB1 (of FIG. 4) and at least one second slit bar SB2 (of FIG. 4).

Each of the first and second slit lines SL1 and SL2 may have a groove shape which is recessed from a top surface of the overcoat layer 144 in a cross-sectional view and may have a bar shape parallel to the first and second data lines DL1 and DL2 in a plan view.

The slit pattern SN may be formed through the same process (a coating of a photoresist, an exposure of a photoresist layer, an etching of an overcoat layer, a development of a photoresist layer and a heat treatment of an overcoat layer) as the microlens ML.

For reducing or minimizing an interference fringe such as a rainbow stain (a rainbow mura), the microlens ML may be disposed to have different rotation angles among the subpixels, and the slit pattern SN may be disposed to correspond to the rotation angle. The detailed structure of the microlens ML and the slit pattern SN may be described afterward.

For example, the overcoat layer 144 may include one of acrylic resin, epoxy resin, phenolic resin, polyamide resin, polyimide resin, unsaturated polyester resin, polyphenylene resin, polyphenylene sulfide resin, benzocyclobutene and photoresist.

A first electrode 146 is disposed in the emission area EA of each of the first and second subpixels SP1 and SP2 on the overcoat layer 144. The first electrode 146 may be connected to a source electrode of the driving TFT through a contact hole in the overcoat layer 144 and the protecting layer 142.

For example, the first electrode 146 may be an anode including a material having a relatively high work function.

A bank layer 148 is disposed in the non-emission area NEA of each of the first and second subpixels SP1 and SP2 on the first electrode 146. The bank layer 148 covers an edge portion of the first electrode 146 and has an opening exposing a central portion of the first electrode 146.

The maximum portion 144a, the slanting portion 144b and the minimum portion 144c constituting the microlens ML are disposed in the entire opening of the bank layer 148. For example, the maximum portion 144a, the slanting portion 144b and the minimum portion 144c of the outermost microlens ML may be disposed to contact an edge portion of the bank layer 148.

The slit pattern SN is disposed between the bank layers 148 of the first and second subpixels SP1 and SP2 to be spaced apart from the bank layers 148 of the first and second subpixels SP1 and SP2.

The opening of the bank layer 148 may be disposed to correspond to each of the first and second color filters CF1 and CF2. For example, the edge portion of the bank layer 148 may overlap an edge portion of each of the first and second color filters CF1 and CF2 to reduce or minimize a leakage of a light not passing through the first and second color filters CF1 and CF2.

An emitting layer 150 is disposed on the first electrode 146 over the entire substrate 140. The emitting layer 150 may have a single layer of an emitting material or a multiple layer of a hole injecting layer, a hole transporting layer, an emitting material layer, an electron transporting layer and an electron injecting layer.

A second electrode 152 is disposed on the emitting layer 150 over the entire substrate 140. For example, the second electrode 152 may be a cathode including a material having a relatively low work function.

The first electrode 146, the emitting layer 150 and the second electrode 152 constitute the LED De.

The first electrode 146, the emitting layer 150 and the second electrode 152 in the emission area EA of each of the first and second subpixels SP1 and SP2 over the overcoat layer 144 are formed to follow the shape of the maximum portion 144a, the slanting portion 144b and the minimum portion 144c of the top surface of the overcoat layer 144 to have a shape of the microlens ML.

A face seal 154 is disposed on the LED De, and a protecting film 156 is disposed on the face seal 154. The face seal 154 may include an organic insulating material or an inorganic insulating material that is transparent and has an adhesion property. The protecting film 156 may have a shape of a thin film.

To prevent penetration of an oxygen or a moisture of an exterior into an interior, the protecting film 156 includes at least two inorganic protecting films. An organic protecting film may be disposed between the at least two inorganic protecting films to improve an impact resistance of the at least two inorganic protecting films.

In a structure where the organic protecting film and the inorganic protecting film are alternately laminated, for preventing penetration of an oxygen or a moisture through a side surface of the organic protecting film, the inorganic protecting film may be disposed to completely wrap the organic protecting film.

Although not shown, for reducing or minimizing reflection of an external light, a retardation plate and a polarizing plate may be disposed under the substrate 140.

In the OLED display device 110 according to a first embodiment of the present disclosure, when a voltage is applied to the first and second electrodes 146 and 152, a hole supplied from the first electrode 146 and an electron supplied from the second electrode 152 are transmitted to the emitting layer 150 to constitute an exciton. Further, when the exciton transitions from an excited state to a ground state, a light is generated.

The light generated in the emitting layer 150 is emitted to an exterior through the transparent first electrode 146, and the OLED display device 110 displays an image.

Since the microlens ML is formed in the overcoat layer 144, the first electrode 146, the emitting layer 150 and the second electrode 152 and a path of a light not extracted to an exterior due to repeated total reflection in the emitting layer 150 is changed toward the substrate 140, a light extraction efficiency is improved.

Further, since the microlens ML of the overcoat layer 144, the first electrode 146, the emitting layer 150 and the second electrode 152 are disposed in entire opening of the bank layer 148 corresponding to the emission layer EA, the entire emission area EA is used for the microlens ML, and a light extraction efficiency is maximized.

In addition, since the slit pattern SN is disposed between the first and second subpixels SP1 and SP2 to correspond to the rotation angle of the microlens ML, a pattern matching rate and an accuracy of a measured position for the microlens ML are improved.

The microlens ML and the slit pattern SN of the OLED display device 110 may be described with reference to drawings.

Figure 3:
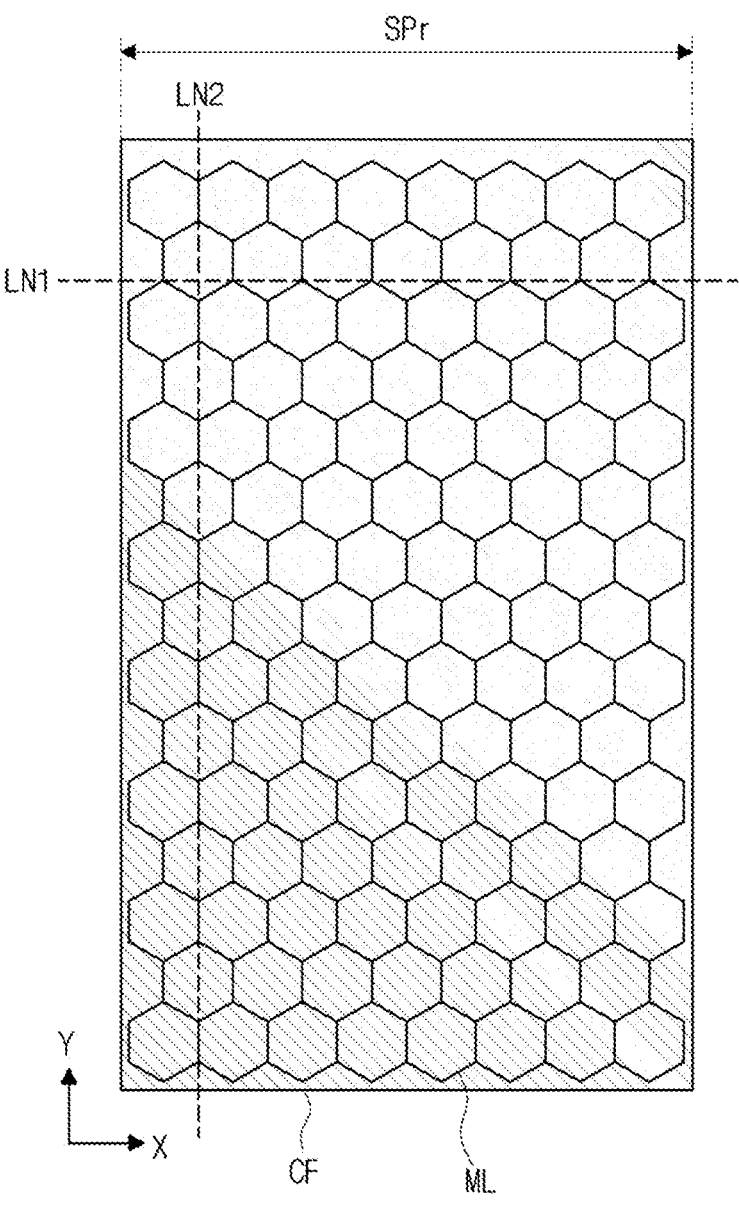
FIG. 3 is a plan view showing a reference subpixel of an organic light emitting diode display device according to a first embodiment of the present disclosure.
Figure 4:
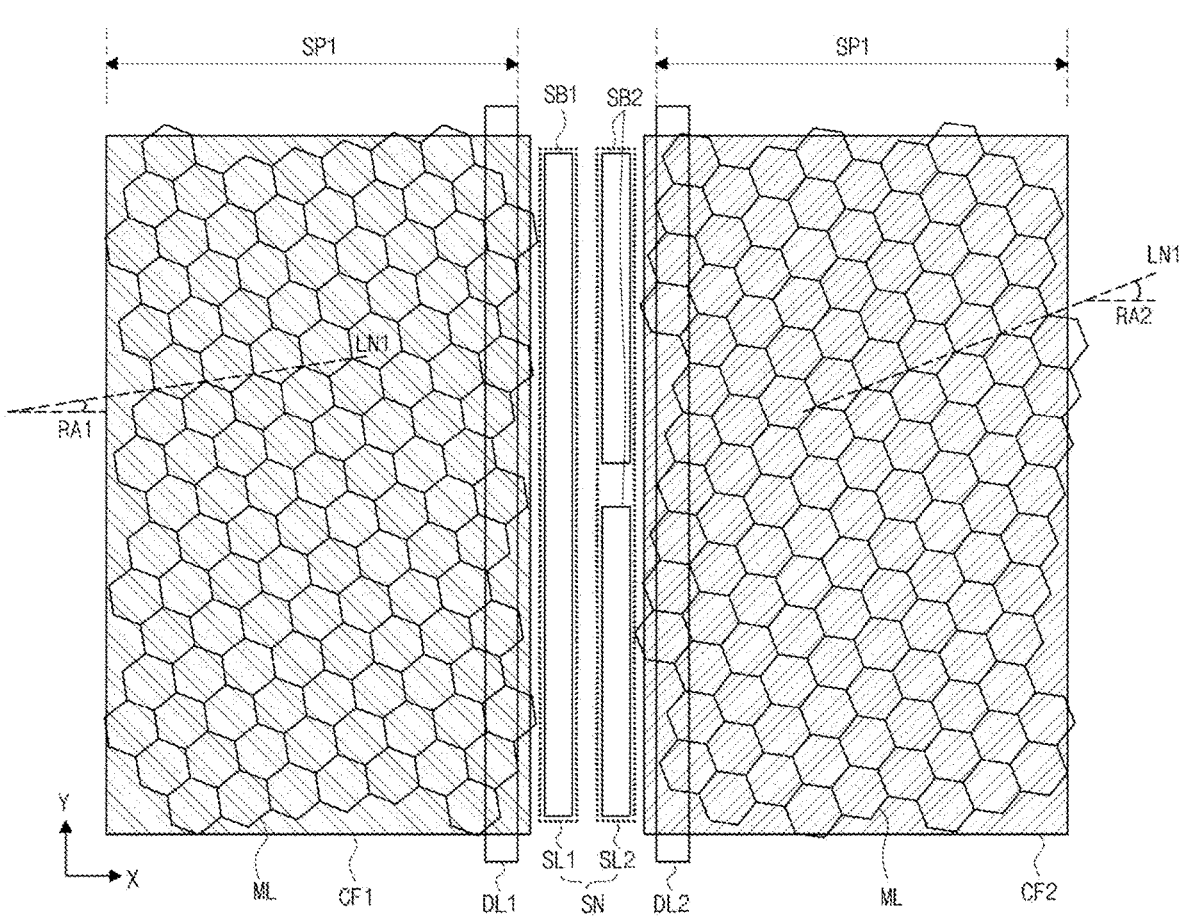
FIG. 4 is a plan view showing first and second subpixels of an organic light emitting diode display device according to a first embodiment of the present disclosure.

FIG. 3 is a plan view showing a reference subpixel of an organic light emitting diode display device according to a first embodiment of the present disclosure, and FIG. 4 is a plan view showing first and second subpixels of an organic light emitting diode display device according to a first embodiment of the present disclosure.

In FIG. 3, the color filter CF is disposed in a reference subpixel SPr of the OLED display device 110 according to a first embodiment of the present disclosure, and the plurality of microlenses ML are disposed on the color filter CF. The plurality of microlenses ML may have a honeycomb shape of a hexagon in a plan view.

In another embodiment, the plurality of microlenses ML may have a honeycomb shape of one of a circle, an ellipse and a tetragon.

For example, the plurality of microlenses ML each having a hexagonal shape may be arranged in a single line along an X axis of a horizontal direction (a first direction) and may be alternately arranged along a Y axis of a vertical direction (a second direction) and a diagonal direction (a third direction).

For example, the plurality of microlenses ML may be disposed such that a first line LN1 connecting vertexes of the hexagonal shapes of the plurality of microlenses ML is parallel to the X axis and a second line LN2 connecting sides of the hexagonal shapes of the plurality of microlenses ML is parallel to the Y axis. Alternatively, the first line LN1 may connect centers of the hexagonal shapes of the plurality of microlenses ML and crossing sides of the hexagonal shapes of the plurality of microlenses ML, and the second line LN2 may connect centers of the hexagonal shapes of the plurality of microlenses ML and overlapping sides of the hexagonal shapes of the plurality of microlenses ML.

The plurality of microlenses ML regularly arranged reflect an incident external light to cause a constructive interference, and an interference fringe such as a rainbow stain (a rainbow mura). A quality of reflection visibility of the OLED display device 110 may be reduced due to the interference fringe.

In the OLED display device 110 according to a first embodiment of the present disclosure, for reducing or minimizing the interference fringe such as the rainbow stain and improving a quality of reflection visibility, the plurality of microlenses ML are disposed to be rotated with different rotation angles in the subpixels.

In the reference subpixel SPr where the plurality of microlenses ML are not rotated, the plurality of microlenses ML are disposed such that the first line LN1 connecting the vertexes of the hexagonal shapes of the plurality of microlenses ML has a rotation angle of 0 degree with respect to the X axis.

In a case that the plurality of microlenses ML have a honeycomb shape of one of a circle, an ellipse and a tetragon, the plurality of microlenses ML are disposed such that the first line LN1 connecting the centers of the plurality of microlenses ML has a rotation angle of 0 degree with respect to the X axis.

In the first subpixel SP1, the plurality of microlenses ML are disposed such that the first line LN1 connecting the vertexes of the hexagonal shapes of the plurality of microlenses ML has a first rotation angle RA1 (of FIG. 4) with respect to the X axis. In the second subpixel SP2, the plurality of microlenses ML are disposed such that the first line LN1 connecting the vertexes of the hexagonal shapes of the plurality of microlenses ML has a second rotation angle RA2 (of FIG. 4) different from the first rotation angle RA1 with respect to the X axis.

In FIG. 4, the plurality of microlenses ML are disposed in each of the first and second subpixels SP1 and SP2 of the OLED display device 110 according to a first embodiment of the present disclosure, and the slit pattern SN is disposed between the first and second subpixels SP1 and SP2. The slit pattern SN is disposed along the Y axis and includes the first and second slit lines SL1 and SL2 along the Y axis. The first slit line SL1 includes at least one first slit bar SB1 disposed along the Y axis and having a bar shape of a rectangle, and the second slit line SL2 includes at least one second slit bar SB2 disposed along the Y axis and having a bar shape of rectangle.

Identically to the reference subpixel SPr, the plurality of microlenses ML in the first and second subpixels SP1 and SP2 may have a honeycomb shape of a hexagon in a plan view.

For example, the plurality of microlenses ML each having a hexagonal shape may be arranged in a single line along a horizontal direction (a first direction) and may be alternately arranged along a vertical direction (a second direction) and a diagonal direction (a third direction).

In the first subpixel SP1, the plurality of microlenses ML are disposed such that the first line LN1 connecting the vertexes of the hexagonal shapes of the plurality of microlenses ML has a first rotation angle RA1 with respect to the X axis. In the second subpixel SP2, the plurality of microlenses ML are disposed such that the first line LN1 connecting the vertexes of the hexagonal shapes of the plurality of microlenses ML has a second rotation angle RA2 different from the first rotation angle RA1 with respect to the X axis.

For example, since the plurality of microlenses ML with a rotation angle of about 60 degrees have the same arrangement as the plurality of microlenses ML with a rotation angle of about 0 degree, each of the first and second rotation angles RA1 and RA2 may be equal to or greater than about 0 degree and may smaller than about 60 degrees.

In the OLED display device 110 according to a first embodiment of the present disclosure, since the plurality of microlenses ML of the adjacent first and second subpixels SP1 and SP2 are disposed such that the first rotation angle RA1 of the first subpixel SP1 and the second rotation angle RA2 of the second subpixel SP2 are different from each other, the interference fringe such as the rainbow stain is reduced or minimized and the quality of reflection visibility is improved.

In a fabrication process of the OLED display device 110 according to a first embodiment of the present disclosure, after the plurality of microlenses ML are disposed on the overcoat layer 144, the plurality of microlenses ML of each of the plurality of subpixels are captured by using a photographic device such as a camera, and the plurality of microlenses ML are inspected by comparing a captured image with a stored reference image.

The plurality of subpixels of the OLED display device 110 have different forms (shape, area, color), and an inspection apparatus stores a plurality of reference images for a case where the plurality of microlenses ML of the plurality of subpixels having different forms are normally formed.

For improving an accuracy of a measured position, the inspection apparatus performs a pattern matching function wherein a pattern form of a predetermined subpixel of the captured image is compared with a pattern form of the plurality of reference images and the equal pattern form is aligned to the corresponding subpixel.

When the plurality of microlenses ML are rotated among the subpixels for reducing or minimizing the interference fringe such as the rainbow stain, the different reference images according to the rotation angle as well as the different reference images according to a model and a color would be obtained and stored. As a result, the number of the stored reference images may be sharply increased, and an inspection time may be sharply increased due to comparison of the captured image with the increased reference images.

For example, when each pixel includes first to fourth subpixels having different shapes and the first to fourth subpixels have 20 different rotation angles, the inspection apparatus may perform the pattern matching function by storing the reference images for 80 pattern forms and comparing one captured image with 80 reference images.

Since the plurality of microlenses ML have the relatively complex honeycomb structure of a hexagon, a recognition rate in comparison of the captured image and the reference image may be reduced and the pattern matching function may not be performed.

For reducing or minimizing increase of the number of the reference images and increase of the inspection time, in the OLED display device 110 according to a first embodiment of the present disclosure, the slit pattern SN between the first and second subpixels SP1 and SP2 has an information on the rotation angle of the plurality of microlenses ML in one of the first and second subpixels SP1 and SP2. Further, the slit pattern SN is stored as the plurality of reference images, and the pattern matching function is performed by using the plurality of reference images for the slit pattern SN.

For example, the slit pattern SN between the adjacent first and second subpixels SP1 and SP2 may include at least one first slit bar SB1 of the first slit line SL1 and at least one second slit bar SB2 of the second slit line SL2 to correspond to the first rotation angle RA1 of the plurality of microlenses ML, and the inspection apparatus may perform the pattern matching function by capturing the slit pattern SN.

Further, the inspection apparatus may recognize the first rotation angle RA1 of the plurality of microlenses ML of the first subpixel SP1 from the slit pattern SN, may compare the selected normal image of the first subpixel SP1 corresponding to the first rotation angle RA1 with the captured image of the first subpixel SP1, and may judge whether the first subpixel SP1 is deteriorated or not according to the comparison result.

The slit pattern SN including the at least one first slit bar SB1 and the at least one second slit bar SB2 may be described with reference to drawings.

Figure 5:
FIG. 5 is a view showing a shape of a slit pattern of an organic light emitting diode display device according to a first embodiment of the present disclosure.
Figure 6:
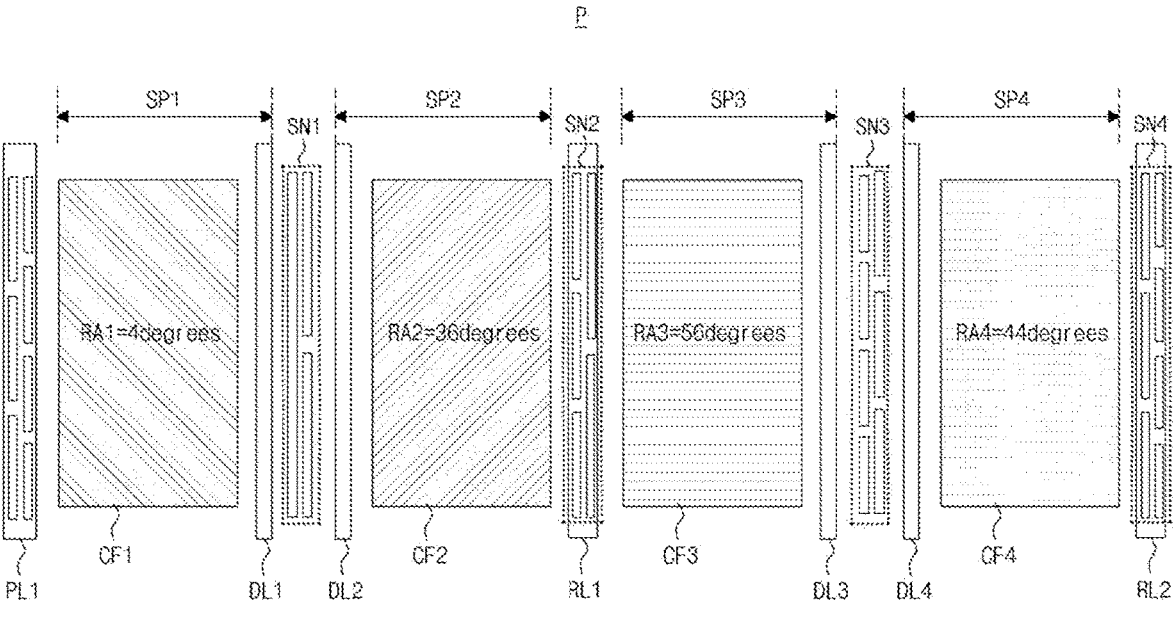
FIG. 6 is a plan view showing a subpixel and a slit pattern of an organic light emitting diode display device according to a first embodiment of the present disclosure.

FIG. 5 is a view showing a shape of a slit pattern of an organic light emitting diode display device according to a first embodiment of the present disclosure, and FIG. 6 is a plan view showing a subpixel and a slit pattern of an organic light emitting diode display device according to a first embodiment of the present disclosure.

In FIG. 5, the slit pattern SN of the OLED display device 110 according to a first embodiment of the present disclosure includes the first and second slit lines SL1 and SL2, and each of the first and second slit lines SL1 and SL2 includes the at least one first slit bar SB1 and the at least one second slit bar SB2.

The at least one first slit bar SB1 of the first slit line SL1 may be divided into a maximum division number of 4 such that the number of the at least one first slit bar SB1 is one of 1 to 4, and the at least one second slit bar SB2 of the second slit line SL2 may be divided into a maximum division number of 5 such that the number of the at least one second slit bar SB2 is one of 1 to 5.

For example, the at least one first slit bar SB1 of the first slit line SL1 may include one of one first slit bar SB1 corresponding to a length of the first slit line SL1, two first slit bars SB1 each corresponding to a half of a length of the first slit line SL1, three first slit bars SB1 each corresponding to one-third of a length of the first slit line SL1 and four first slit bars SB1 each corresponding to a quarter of a length of the first slit line SL1. The at least one second slit bar SB2 of the second slit line SL2 may include one of one second slit bar SB2 corresponding to a length of the second slit line SL2, two second slit bars SB2 each corresponding to a half of a length of the second slit line SL2, three second slit bars SB2 each corresponding to one-third of a length of the second slit line SL2, four second slit bars SB2 each corresponding to a quarter of a length of the second slit line SL2 and five second slit bars SB2 each corresponding to one-fifth of a length of the second slit line SL2.

As a result, the number of the first slit bar SB1 and the number of the second slit bar SB2 of the slit pattern SN may be formed of one of (1, 1), (1, 2), . . . , (1, 5), (2, 1), (2, 2), . . . , (2, 5), (3, 1), (3, 2), . . . , (3, 5), (4, 1), (4, 2), . . . , (4, 4) and (4, 5) to correspond to the rotation angle of one of 0 degree, 3 degrees, 6 degrees, . . . , 54 degrees and 57 degrees.

In a generalized case where the slit pattern SN includes the first and second slit lines SL1 and SL2, the first and second slit lines SL1 and SL2 are divided into a maximum number of a and a maximum number of b, respectively, to include a kinds of first slit bars SB1 and b kinds of second slit bars SB2, respectively, and the plurality of microlenses ML has c kinds of rotation angles RA, the slit pattern SN may have an information on all of the rotation angles RA by forming the slit pattern SN such that a product of the maximum division number of a for the first slit bar SB1 and the maximum division number of b for the second slit bar SB2 is greater than the number of kinds of c for the rotation angles RA of the microlens ML. (a*b>c)

For example, when each pixel includes first to fourth subpixels having different shapes and the plurality of microlenses ML of the first to fourth subpixels have 20 kinds of rotation angles that differ by 3 degrees each, the inspection apparatus may store 20 reference images for the slit pattern SN and the pattern matching function may be performed by comparing one captured image with the 20 reference images.

When the inspection apparatus individually and sequentially captures the first and second slit lines SL1 and SL2 of the slit pattern SN, the inspection apparatus may store 4 reference images for the first slit bar SB1 of the first slit line SL1 and 5 reference images for the second slit bar SB2 of the second slit line SL2 and may perform the pattern matching function by comparing one captured image with total 9 reference images. As a result, the number of reference images and the inspection time may be reduced.

In FIG. 6, the pixel P of the OLED display device 110 according to a first embodiment of the present disclosure includes first to fourth subpixels SP1 to SP4 sequentially disposed along a horizontal direction, and first to fourth color filters CF1 to CF4 are disposed in the first to fourth subpixels SP1 to SP4, respectively. For example, the first to fourth color filters CF1 to CF4 may correspond to red, blue, white and green colors (R, B, W, G), respectively.

A first power line PL1 is disposed at a left of the first subpixel SP1 along a vertical direction, and first and second data lines DL1 and DL2 are disposed between the first and second subpixels SP1 and SP2 along the vertical direction. A first reference line RL1 is disposed between the second and third subpixels SP2 and SP3 along the vertical direction, and third and fourth data lines DL3 and DL4 are disposed between the third and fourth subpixels SP3 and SP4 along the vertical direction. A second power line PL2 is disposed at a right of the fourth subpixel SP4 along the vertical direction.

For example, the first to fourth data lines DL1 to DL4 may be connected to the first to fourth subpixels SP1 to SP4, respectively, to supply the data signal, and the first power line PL1 may be connected to the first to fourth subpixels SP1 to SP4 to supply a high level voltage. The first reference line RL1 may be connected to the first to fourth subpixels SP1 to SP4 to supply a reference voltage, and the second power line PL2 may be connected to fifth to eighth subpixels (not shown) to supply the high level voltage.

First to fourth slit patterns SN1 to SN4 are disposed at rights of the first to fourth subpixels SP1 to SP4, respectively. The first slit pattern SN1 is disposed between the first and second data lines DL1 and DL2, and the second slit pattern SN2 is disposed to overlap the first reference line RL1. The third slit pattern SN3 is disposed between the third and fourth data lines DL3 and DL4, and the fourth slit pattern SL4 is disposed to overlap the second power line PL2.

The first to fourth slit patterns SN1 to SN4 have a structure corresponding to rotation angles of the plurality of microlenses ML of the first to fourth subpixels SP1 to SP4, respectively.

For example, when first to fourth rotation angles RA1 to RA4 of the plurality of microlenses ML of the first to fourth subpixels SP1 to SP4 are about 4 degrees, about 36 degrees, about 56 degrees and about 44 degrees, the first slit pattern SN1 may include one first slit bar SB1 and two second slit bars SB2 corresponding to the first rotation angle RA1 of about 4 degrees, and the second slit pattern SN2 may include three first slit bars SB1 and two slit bars SB2 corresponding to the second rotation angle RA2 of about 36 degrees. The third slit pattern SN3 may include four first slit bars SB1 and three second slit bars SB2 corresponding to the third rotation angle RA3 of about 56 degrees, and the fourth slit pattern SN4 may include three first slit bars SB1 and four slit bars SB2 corresponding to the fourth rotation angle RA4 of about 44 degrees.

In the OLED display device 110 according to a first embodiment of the present disclosure, since the slit pattern SN between the first and second subpixels SP1 and SP2 includes the at least one (1 to 4) first slit bar SB1 and the at least one (1 to 5) second slit bar SB2, the slit pattern SN may include an information on the plurality (20 that differ by 3 degrees each) of rotation angles.

Since the inspection apparatus performs the pattern matching function by using the reference images of the plurality (20) of slit patterns SN, the number of the reference images and the inspection time may be reduced or minimized.

Further, since the first and second slit bars SB1 and SB2 having a bar shape are captured, the recognition rate in comparison of the captured image and the reference image may be improved and the accuracy of a measured position in the pattern matching function may be improved.

The reduction or minimization of the light leakage between the adjacent subpixels due to the slit pattern SN may be described with reference to a drawing.

Figure 7:
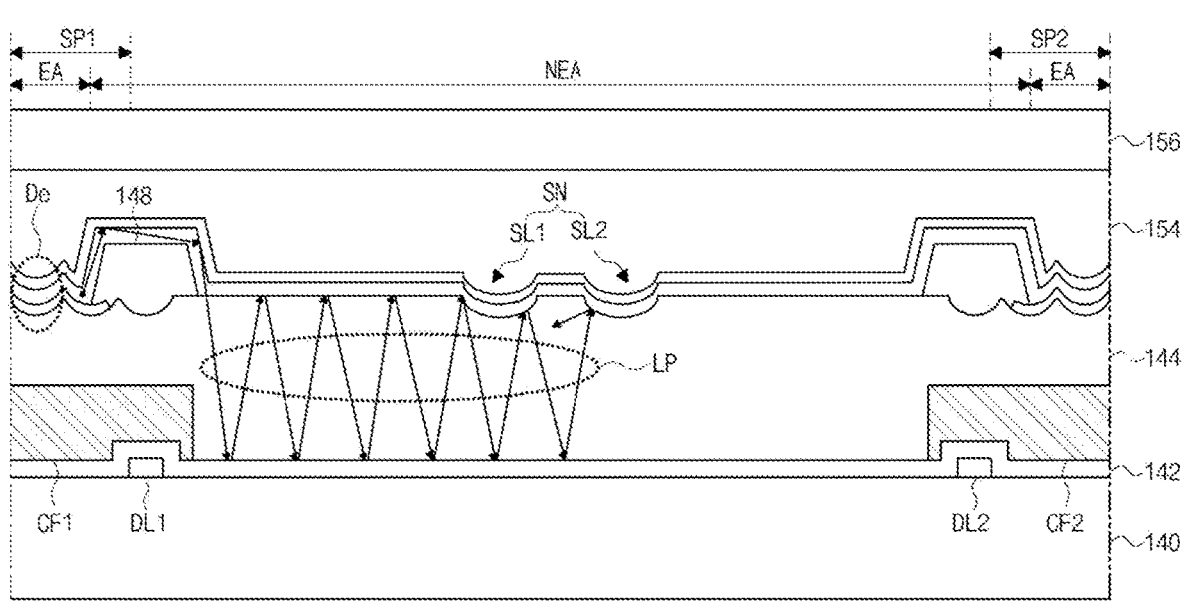
FIG. 7 is a cross-sectional view showing a light path in an organic light emitting diode display device according to a first embodiment of the present disclosure.

FIG. 7 is a cross-sectional view showing a light path in an organic light emitting diode display device according to a first embodiment of the present disclosure.

In FIG. 7, after a light emitted from the emitting layer 150 of the LED De of the first subpixel SP1 is reflected on an interface between the bank layer 148 and the emitting layer 150 and an interface between the emitting layer 150 and the second electrode 152, the light may be transmitted to the adjacent second subpixel SP2 due to a total reflection on an interface between the protecting layer 142 and the overcoat layer 144 and an interface between the overcoat layer 144 and the emitting layer 150 to cause a light leakage.

In the OLED display device 110 according to a first embodiment of the present disclosure, since the slit pattern SN of the first and second slit lines SL1 and SL2 is disposed on the overcoat layer 144 of the non-emission area NEA, the light of the first subpixel SP1 is totally reflected by at least one of the first and second slit lines SL1 and SL2 of the slit pattern SN to have a light path LP where the light is not transmitted to the second subpixel SP2.

The light path LP may be applied to a light emitted from the first subpixel SP1 along a vertical direction and a diagonal direction due to the plurality of first bars SB1 and the plurality of second slit bars SB2 of the first and second slit lines SL1 and SL2 as well as a light emitted from the first subpixel SP1 along a horizontal direction due to the first and second slit lines SL1 and SL2.

As a result, in the OLED display device 110 according to a first embodiment of the present disclosure, a light leakage along the horizontal direction, the vertical direction and the diagonal direction between the adjacent subpixels is reduced or minimized due to the slit pattern SN.

Although the light path LP where the light transmission is blocked due to two slit lines SL1 and SL2 is exemplarily shown in FIG. 7, the light transmission may be changed even by one slit line SL1 or SL2 and a light leakage along the horizontal direction, the vertical direction and the diagonal direction between the adjacent subpixels may be reduced.

Although the slit pattern SN is exemplarily disposed between the adjacent subpixels at left and right in a first embodiment, the slit pattern may be disposed between the adjacent subpixels at up and down in another embodiment.

The 15 rotation angles that differ by 4 degrees each may be described with reference to a drawing.

Figure 8:
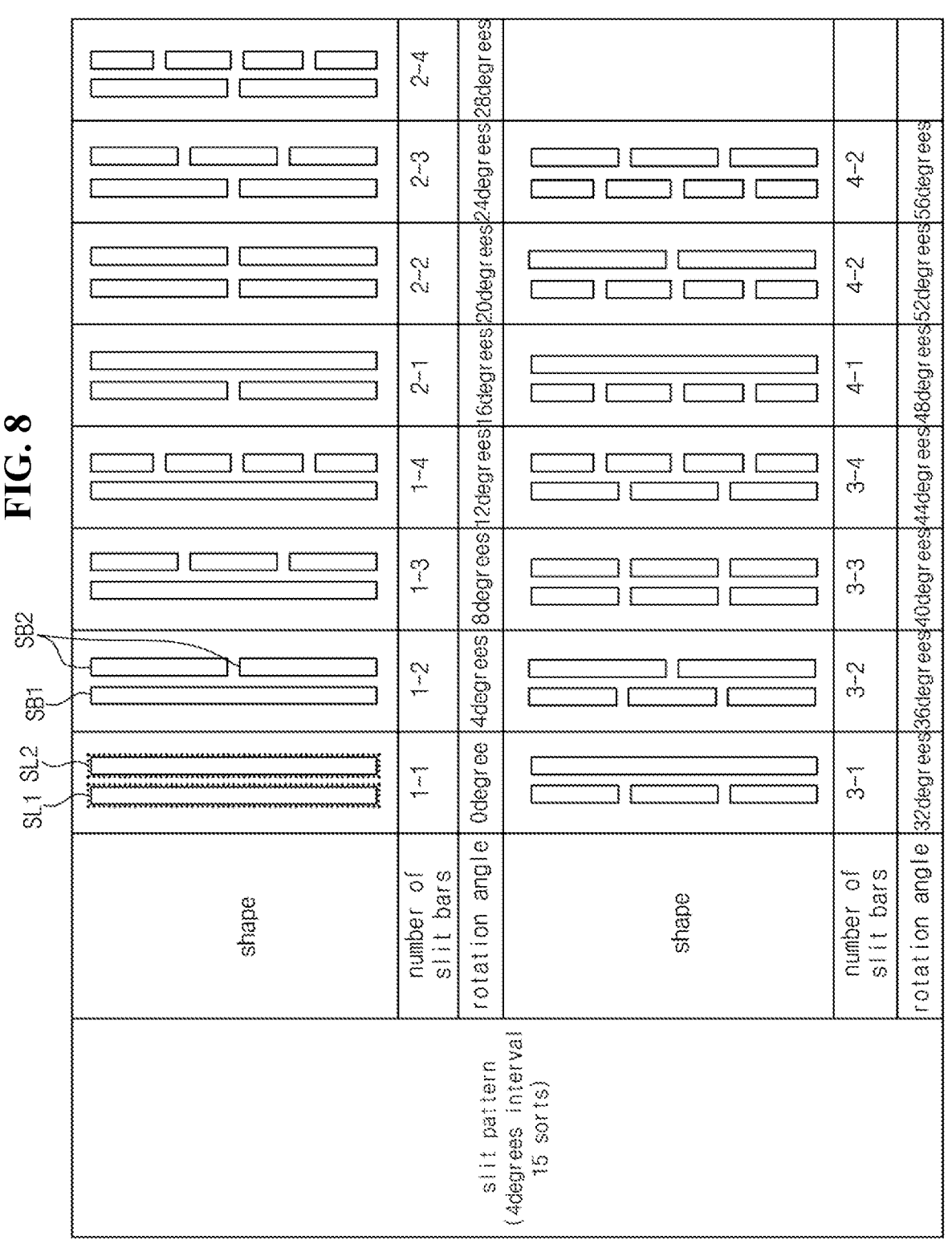
FIG. 8 is a view showing a shape of a slit pattern of an organic light emitting diode display device according to a second embodiment of the present.

FIG. 8 is a view showing a shape of a slit pattern of an organic light emitting diode display device according to a second embodiment of the present disclosure. Illustration on a part the same as that of a first embodiment may be omitted.

In FIG. 8, a slit pattern SN of an organic light emitting diode (OLED) display device according to a second embodiment of the present disclosure includes first and second slit lines SL1 and SL2, and each of the first and second slit lines SL1 and SL2 includes at least one first slit bar SB1 and at least one second slit bar SB2.

The at least one first slit bar SB1 of the first slit line SL1 may be divided into a maximum division number of 4 such that the number of the at least one first slit bar SB1 is one of 1 to 4, and the at least one second slit bar SB2 of the second slit line SL2 may be divided into a maximum division number of 4 such that the number of the at least one second slit bar SB2 is one of 1 to 4.

For example, the first slit line SL1 may include one of one first slit bar SB1 corresponding to a length of the first slit line SL1, two first slit bars SB1 each corresponding to a half of a length of the first slit line SL1, three first slit bars SB1 each corresponding to one-third of a length of the first slit line SL1 and four first slit bars SB1 each corresponding to a quarter of a length of the first slit line SL1. The second slit line SL2 may include one of one second slit bar SB2 corresponding to a length of the second slit line SL2, two second slit bars SB2 each corresponding to a half of a length of the second slit line SL2, three second slit bars SB2 each corresponding to one-third of a length of the second slit line SL2 and four second slit bars SB2 each corresponding to a quarter of a length of the second slit line SL2.

As a result, the number of the first slit bar SB1 and the number of the second slit bar SB2 of the slit pattern SN may be formed of one of (1, 1), (1, 2), . . . , (1, 4), (2, 1), (2, 2), . . . , (2, 4), (3, 1), (3, 2), . . . , (3, 4), (4, 1), (4, 2), (4, 3) and (4, 4) to correspond to the rotation angle of one of 0 degree, 4 degrees, 8 degrees, . . . , 52 degrees and 56 degrees.

For example, when each pixel includes first to fourth subpixels having different shapes and the plurality of microlenses ML of the first to fourth subpixels have 15 kinds of rotation angles that differ by 4 degrees each, the inspection apparatus may store 15 reference images for the slit pattern SN and the pattern matching function may be performed by comparing one captured image with the 15 reference images.

When an inspection apparatus individually and sequentially captures the first and second slit lines SL1 and SL2 of the slit pattern SN, the inspection apparatus may store 4 reference images for the first slit bar SB1 of the first slit line SL1 and 4 reference images for the second slit bar SB2 of the second slit line SL2 and may perform a pattern matching function by comparing one captured image with total 8 reference images. As a result, the number of reference images and an inspection time may be reduced.

In the OLED display device according to a second embodiment of the present disclosure, since the slit pattern SN between the first and second subpixels SP1 and SP2 includes the at least one (1 to 4) first slit bar SB1 and the at least one (1 to 4) second slit bar SB2, the slit pattern SN may include an information on the plurality (15 that differ by 4 degrees each) of rotation angles.

Since the inspection apparatus performs the pattern matching function by using the reference images of the plurality (15) of slit patterns SN, the number of the reference images and the inspection time may be reduced or minimized.

Further, since the first and second slit bars SB1 and SB2 having a bar shape are captured, a recognition rate in comparison of the captured image and the reference image may be improved and an accuracy of a measured position in the pattern matching function may be improved.

In addition, a light leakage along a horizontal direction, a vertical direction and a diagonal direction between adjacent subpixels is reduced or minimized due to the slit pattern SN.

Consequently, in the OLED display device according to the present disclosure, since an inspection step is performed using a slit pattern corresponding to a rotation angle of a microlens at a periphery of each subpixel, the pattern matching rate and the accuracy of a measured position are improved in the inspection step, and an optimization of a process is obtained due to reduction of a production energy.

Further, since a slit pattern corresponding to a rotation angle of a microlens is formed of a plurality of slit lines each including at least one slit bar, the pattern matching rate and the accuracy of a measured position are improved, and light leakage between adjacent subpixels is reduced or minimized.

It will be apparent to those skilled in the art that various modifications and variation can be made in the present disclosure without departing from the scope of the disclosure. Thus, it is intended that the present disclosure cover the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising:

a substrate having a plurality of subpixels;

an overcoat layer on the substrate; and a light emitting diode in each of the plurality of subpixels on the overcoat layer, wherein a top surface of the overcoat layer in each of adjacent two subpixels of the plurality of subpixels includes a plurality of microlenses, the plurality of microlenses in one of the adjacent two subpixels have a rotation angle different from the rotation angle of the plurality of microlenses in the other of the adjacent two subpixels, and wherein the top surface of the overcoat layer between the adjacent two subpixels includes a slit pattern corresponding to the rotation angle of the plurality of microlenses in the one of the adjacent two subpixels.

2. The display device of claim 1, wherein the rotation angle of the plurality of microlenses in each of the adjacent two subpixels is defined by a line connecting the vertexes of the hexagonal shapes of the plurality of microlenses with respect to a X axis of a horizontal direction.

3. The display device of claim 1, wherein the slit pattern includes first and second slit lines parallel to each other, wherein the first slit line includes at least one first slit bar, and wherein the second slit line includes at least one second slit bar.

4. The display device of claim 3, wherein the at least one first slit bar includes kinds of a of the first slit bars obtained by dividing the first slit line into a maximum division number of a, wherein the at least one second slit bar includes kinds of b of the second slit bars obtained by dividing the second slit line into a maximum division number of b, wherein the plurality of microlenses of one of the plurality of subpixels includes kinds of c of the rotation angles, and wherein a product of the maximum division number of a of the first slit bars and the maximum division number of b of the second slit bars is greater than the kind number of c of the rotation angles of the plurality of microlenses.

5. The display device of claim 3, wherein the at least one first slit bar includes one of one first slit bar corresponding to a length of the first slit line, two first slit bars each corresponding to a half of a length of the first slit line, three first slit bars each corresponding to one-third of a length of the first slit line and four first slit bars each corresponding to a quarter of a length of the first slit line, wherein the at least one second slit bar includes one of one second slit bar corresponding to a length of the second slit line, two second slit bars each corresponding to a half of a length of the second slit line, three second slit bars each corresponding to one-third of a length of the second slit line, four second slit bars each corresponding to a quarter of a length of the second slit line and five second slit bars each corresponding to one-fifth of a length of the second slit line, and wherein the plurality of microlenses of one of the plurality of subpixels have 20 rotation angles that differ by 3 degrees each.

6. The display device of claim 3, wherein the at least one first slit bar includes one of one first slit bar corresponding to a length of the first slit line, two first slit bars each corresponding to a half of a length of the first slit line, three first slit bars each corresponding to one-third of a length of the first slit line and four first slit bars each corresponding to a quarter of a length of the first slit line, and wherein the at least one second slit bar includes one of one second slit bar corresponding to a length of the second slit line, two second slit bars each corresponding to a half of a length of the second slit line, three second slit bars each corresponding to one-third of a length of the second slit line and four second slit bars each corresponding to a quarter of a length of the second slit line, and wherein the plurality of microlenses of one of the plurality of subpixels have 15 rotation angles that differ by 4 degrees each.

7. The display device of claim 1, wherein the slit pattern has a bar shape.

8. The display device of claim 1, wherein the rotation angles of the plurality of microlenses are equal to or greater than 0 degree and smaller than 60 degrees.

9. The display device of claim 1, wherein the plurality of subpixels includes first to fourth subpixels, and wherein the slit pattern includes first to fourth slit patterns disposed at rights of the first to fourth subpixels, respectively, and corresponding to the rotation angles of the plurality of microlenses of the first to fourth subpixels, respectively.

10. The display device of claim 9, wherein a first power line is disposed at a left of the first subpixel, first and second data lines are disposed between the first and second subpixels, a first reference line is disposed between the second and third subpixels, third and fourth data lines are disposed between the third and fourth subpixels, and a second power line is disposed at a right of the fourth subpixel, and wherein the first slit pattern is disposed between the first and second data lines, the second slit pattern is disposed to overlap the first reference line, the third slit pattern is disposed between the third and fourth data lines, and the fourth slit pattern is disposed to overlap the second power line.

11. The display device of claim 1, further comprising:

a thin film transistor in each of the plurality of subpixels on the substrate, the thin film transistor electrically connected to the light emitting diode;

a color filter in each of the plurality of subpixels between the thin film transistor and the overcoat layer; and a face seal and a protecting film sequentially on the light emitting diode.

12. The display device of claim 1, further comprising a bank layer in each of the plurality of subpixels and exposing a central portion of the first electrode, wherein the light emitting diode includes a first electrode in each of the plurality of subpixels, an emitting layer on the first electrode and a second electrode on the emitting layer, and wherein the slit pattern is disposed between the bank layers spaced apart from each other of adjacent two of the plurality of subpixels.

13. The display device of claim 12, wherein the slit pattern is spaced apart from the bank layers of the adjacent two of the plurality of subpixels.

* * * * *